US012641909B2

(12) United States Patent (10) Patent No.: US 12,641,909 B2

Ho et al. (45) Date of Patent: May 26, 2026

(54) METHOD OF FABRICATING A HALIDE PEROVSKITE

(71) Applicant: City University of Hong Kong, Kowloon (HK)

(72) Inventors: Chung Yin Johnny Ho, Shatin (HK); You Meng, Kowloon (HK); Zhengxun Lai, Kowloon (HK); Wei Wang, Kowloon (HK)

(73) Assignee: City University of Hong Kong, Kowloon (HK)

( * ) Notice: Subject to any disclaimer, the term of this patent is extended or adjusted under 35 U.S.C. 154(b) by 604 days.

(21) Appl. No.: 17/991,095

(22) Filed: Nov. 21, 2022

(65) Prior Publication Data

US 2024/0170591 A1 May 23, 2024

(51) Int. Cl.
| | |
|---|---|
| *C01G 21/00* | (2006.01) |
| *H10F 30/21* | (2025.01) |
| *H10F 71/00* | (2025.01) |
| *H10F 77/12* | (2025.01) |
| *H10F 77/14* | (2025.01) |

(52) U.S. Cl.
CPC ........... *H10F 77/12* (2025.01); *C01G 21/006* (2013.01); *H10F 30/21* (2025.01); *H10F 71/00* (2025.01); *H10F 77/147* (2025.01)

(58) Field of Classification Search
CPC ...... C01G 21/00; C01G 21/006; C01G 19/00; C01D 3/00; C01D 3/02; C01D 3/04; C01D 3/10; C01D 3/12; C01P 2002/34
See application file for complete search history.

(56) References Cited

PUBLICATIONS

Wang, Yaguang, et al. "Temperature Difference Triggering Controlled Growth of All-Inorganic Perovskite Nanowire Arrays in Air." Small 14.41 (2018): 1803010.*
Yu, Lei, et al. "Solid-Liquid-Vapor Synthesis of Negative Metal Oxide Nanowire Arrays." Chemistry of Materials 28.24 (2016): 8924-8929.*
Teixeira, Guilhermina Ferreira, et al. "Perovskite structure associated with precious metals: influence on heterogenous catalytic process." Catalysts 9.9 (2019): 721.*
Satta, Jessica, et al. "Stable CsPbBr3 Nanocrystals—Decorated Nanoporous Gold for Optoelectronic Applications." Crystals 12.6 (2022): 863.*
Hossain, Mohammad Kamal, et al. "Mechanism of non-catalytic chemical vapor deposition growth of all-inorganic CsPbX 3 (X=Br, Cl) nanowires." Journal of Materials Chemistry C 9.9 (2021): 3229-3238.*
Ha, Son-Tung, et al. "Metal halide perovskite nanomaterials: synthesis and applications." Chemical science 8.4 (2017): 2522-2536.*
Kahen, K. B., Irene A. Goldthorpe, and John Minter. "Low temperature II-VI nanowire growth using Au—Sn catalysts." Journal of crystal growth 322.1 (2011): 57-62.*

(Continued)

*Primary Examiner* — Richard M Rump
(74) *Attorney, Agent, or Firm* — Renner, Kenner, Greive, Bobak, Taylor & Weber

(57) ABSTRACT

A method of fabricating a halide perovskite having a general formula of $ABX_3$, wherein A, B, and X are inorganic elements and X is a halide, the method including a vapor-liquid-solid process triggered by a catalyst formed from a noble metal; A nanowire of the halide perovskite and a photoelectronic device thereof.

24 Claims, 9 Drawing Sheets

(56) References Cited

PUBLICATIONS

Meyers, Jonathan K., et al. "Self-catalyzed vapor-liquid-solid growth of lead halide nanowires and conversion to hybrid perovskites." Nano Letters 17.12 (2017): 7561-7568.*

Gu, L.; Poddar, S.; Lin, Y.; Long, Z.; Zhang, D.; Zhang, Q.; Shu, L.; Qiu, X.; Kam, M.; Javey, A.; Fan, Z. A biomimetic eye with a hemispherical perovskite nanowire array retina. Nature 2020, 581 (7808), 278-282.

Wang, Y.; Wan, Z.; Qian, Q.; Liu, Y.; Kang, Z.; Fan, Z.; Wang, P.; Wang, Y.; Li, C.; Jia, C.; et al. Probing photoelectrical transport in lead halide perovskites with van der Waals contacts. Nat. Nanotechnol. 2020, 15 (9), 768-775.

"Zhang, D.; Zhang, Q.; Ren, B.; Zhu, Y.; Abdellah, M.; Fu, Y.; Cao, B.; Wang, C.; Gu, L.; Ding, Y.; Tsui, K.-H.; Fan, S.; Poddar, S.; Shu, L.; Zhang, Y.; Kuang, D.-B.; Liao, J.-F.; Lu, Y.; Zheng, K.; He, Z.; Fan, Z. Large-scale planar and spherical light-emitting diodes based on arrays of perovskite quantum wires. Nat. Photonics 2022, 16 (4),284-290".

Liu, A.; Zhu, H.; Bai, S.; Reo, Y.; Zou, T.; Kim, M.-G.; Noh, Y.-Y. High-performance inorganic metal halide perovskite transistors. Nat. Electron. 2022, 5 (2), 78-83.

Liu, Q.; Gao, S.; Xu, L.; Yue, W.; Zhang, C.; Kan, H.; Li, Y.; Shen, G. Nanostructured perovskites for nonvolatile memory device. Chem. Soc. Rev. 2022, 51 (9), 3341-3379.

Zhang, Y.; Poddar, S.; Huang, H.; Gu, L.; Zhang, Q.; Zhou, Y.; Yan, S.; Zhang, S.; Song, Z.; Huang, B.; et al. Three-dimensional perovskite nanowire array-based ultrafast resistive RAM with ultralong data retention. Sci. Adv. 2021, 7 (36), No. eabg3788.

Shoaib, M.; Zhang, X.; Wang, X.; Zhou, H.; Xu, T.; Wang, X.; Hu, X.; Liu, H.; Fan, X.; Zheng, W.; Yang, T.; Yang, S.; Zhang, Q.; Zhu, X.; Sun, L.; Pan, A. Directional Growth of Ultralong CsPbBr3 Perovskite Nanowires for High-Performance Photodetectors. J. Am. Chem. Soc. 2017, 139 (44), 15592-15595.

Chen, J.; Fu, Y.; Samad, L.; Dang, L.; Zhao, Y.; Shen, S.; Guo, L.; Jin, S. Vapor-Phase Epitaxial Growth of Aligned Nanowire Networks of Cesium Lead Halide Perovskites (CsPbX3, X=Cl, Br, I). Nano Lett. 2017, 17 (1), 460-466.

Wang, Y.; Jia, C.; Fan, Z.; Lin, Z.; Lee, S.-J.; Atallah, T. L.; Caram, J. R.; Huang, Y.; Duan, X. Large-area synthesis and patterning of all-inorganic lead halide perovskite thin films and heterostructures. Nano Lett. 2021, 21 (3), 1454 1460.

Chen, J.; Morrow, D. J.; Fu, Y.; Zheng, W.; Zhao, Y.; Dang, L.; Stolt, M. J.; Kohler, D. D.; Wang, X.; Czech, K. J.; Hautzinger, M. P.; Shen, S.; Guo, L.; Pan, A.; Wright, J. C.; Jin, S. Single-Crystal Thin Films of Cesium Lead Bromide Perovskite Epitaxially Grown on Metal Oxide Perovskite (SrTiO3). J. Am. Chem. Soc. 2017, 139 (38), 13525-13532.

Li, S.; Lin, Y.-C.; Zhao, W.; Wu, J.; Wang, Z.; Hu, Z.; Shen, Y.; Tang, D.-M.; Wang, J.; Zhang, Q.; Zhu, H.; Chu, L.; Zhao, W.; Liu, C.; Sun, Z.; Taniguchi, T.; Osada, M.; Chen, W.; Xu, Q.-H.; Wee, A. T. S.; Suenaga, K.; Ding, F.; Eda, G. Vapour-liquid-solid growth of monolayer MoS2 nanoribbons. Nat. Mater. 2018, 17 (6), 535-542.

Meng, Y.; Li, F.; Lan, C.; Bu, X.; Kang, X.; Wei, R.; Yip, S.; Li, D.; Wang, F.; Takahashi, T.; et al. Artificial visual systems enabled by quasi-two-dimensional electron gases in oxide superlattice nanowires. Sci. Adv. 2020, 6 (46), No. eabc6389.

Li, D.; Lan, C.; Manikandan, A.; Yip, S.; Zhou, Z.; Liang, X.; Shu, L.; Chueh, Y.-L.; Han, N.; Ho, J. C. Ultra-fast photodetectors based on high-mobility indium gallium antimonide nanowires. Nat. Commun. 2019, 10 (1), 1664.

Meng, Y.; Lan, C.; Li, F.; Yip, S.; Wei, R.; Kang, X.; Bu, X.; Dong, R.; Zhang, H.; Ho, J. C. Direct Vapor-Liquid-Solid Synthesis of All-Inorganic Perovskite Nanowires for High-Performance Electronics and Optoelectronics. ACS Nano 2019, 13 (5), 6060-6070.

Meng, Y.; Lai, Z.; Li, F.; Wang, W.; Yip, S.; Quan, Q.; Bu, X.; Wang, F.; Bao, Y.; Hosomi, T.; et al. Perovskite Core-Shell Nanowire Transistors: Interfacial Transfer Doping and Surface Passivation. ACS Nano 2020, 14 (10), 12749 12760.

Meyers, J. K.; Kim, S.; Hill, D. J.; Cating, E. E. M.; Williams, L. J.; Kumbhar, A. S.; McBride, J. R.; Papanikolas, J. M.; Cahoon, J. F. Self-Catalyzed Vapor-Liquid-Solid Growth of Lead Halide Nanowires and Conversion to Hybrid Perovskites. Nano Lett. 2017, 17 (12), 7561-7568.

Jiang, Y.; Wang, X.; Pan, A. Properties of Excitons and Photogenerated Charge Carriers in Metal Halide Perovskites. Adv. Mater. 2019, 31, 1806671.

Colinet, C.; Pasturel, A.; Percheron-Guegan, A.; Achard, J. Enthalpies of formation of liquid and solid binary alloys of lead, antimony and bismuth with rare earth elements. J. Less-Common Met. 1984, 102 (2), 239-249.

Miedema, A.; De Chatel, P.; De Boer, F. Cohesion in alloys—fundamentals of a semi-empirical model. Physica B+C 1980, 100 (1), 1-28.

Michel, M.; Castanet, R. Calorimetric investigation of the Au—Pb system. J. Alloys Compd. 1992, 185 (2), 241-249.

Evans, D. S.; Prince, A. The Au—Pb Phase Diagram. MRS Online Proceedings Library (OPL) 1982, 19, 383-388.

Sutton, R. J.; Filip, M. R.; Haghighirad, A. A.; Sakai, N.; Wenger, B.; Giustino, F.; Snaith, H. J. Cubic or Orthorhombic? Revealing the Crystal Structure of Metastable Black-Phase CsPbI3 by Theory and Experiment. ACS Energy Lett. 2018, 3 (8), 1787-1794.

Steele, J. A.; Jin, H.; Dovgaliuk, I.; Berger, R. F.; Braeckevelt, T.; Yuan, H.; Martin, C.; Solano, E.; Lejaeghere, K.; Rogge, S. M.; et al. Thermal unequilibrium of strained black CsPbI3 thin films. Science 2019, 365 (6454), 679-684.

Lin, Z.; Folgueras, M. C.; Le, H. K. D.; Gao, M.; Yang, P. Laser-accelerated phase transformation in cesium lead iodide perovskite. Matter 2022, 5 (5), 1455-1465.

Lin, Z.; Zhang, Y.; Gao, M.; Steele, J. A.; Louisia, S.; Yu, S.; Quan, L. N.; Lin, C.-K.; Limmer, D. T.; Yang, P. Kinetics of moisture-induced phase transformation in inorganic halide perovskite. Matter 2021, 4 (7), 2392-2402.

Pelton, A. The Au—Cs (Gold-Cesium) system. Bull. Alloy Phase Diagrams 1986, 7 (1), 19-23.

Janssen, E. The pseudo-binary phase diagram Agl-Aul. J. Less-Common Met. 1978, 59 (2), 65-72.

Niu, G.; Yu, H.; Li, J.; Wang, D.; Wang, L. Controlled orientation of perovskite films through mixed cations toward high performance perovskite solar cells. Nano Energy 2016, 27, 87-94.

Van der Stam, W.; Geuchies, J. J.; Altantzis, T.; van den Bos, K. H. W.; Meeldijk, J. D.; Van Aert, S.; Bals, S.; Vanmaekelbergh, D.; deMello Donega, C. Highly Emissive Divalent-Ion-Doped Colloidal CsPb1—xMxBr3 Perovskite Nanocrystals through Cation Exchange. J. Am. Chem. Soc. 2017, 139 (11), 4087-4097.

Castelli, I. E.; Garcia-Lastra, J. M.; Thygesen, K. S.; Jacobsen, K. W. Bandgap calculations and trends of organometal halide perovskites. APL Mater. 2014, 2 (8), 081514.

Zou, S.; Liu, C.; Li, R.; Jiang, F.; Chen, X.; Liu, Y.; Hong, M. From Nonluminescent to Blue-Emitting Cs4PbBr6 Nanocrystals: Tailoring the Insulator Bandgap of 0D Perovskite through Sn Cation Doping. Adv. Mater. 2019, 31 (24), 1900606.

Domanski, K.; Correa-Baena, J.-P.; Mine, N.; Nazeeruddin, M. K.; Abate, A.; Saliba, M.; Tress, W.; Hagfeldt, A.; Gratzel, M. Not All That Glitters Is Gold: Metal-Migration-Induced Degradation in Perovskite Solar Cells. ACS Nano 2016, 10 (6), 6306-6314.

Shen, X.; Zhang, Y.; Kershaw, S. V.; Li, T.; Wang, C.; Zhang, X.; Wang, W.; Li, D.; Wang, Y.; Lu, M.; Zhang, L.; Sun, C.; Zhao, D.; Qin, G.; Bai, X.; Yu, W. W.; Rogach, A. L. Zn-Alloyed CsPbI3 Nanocrystals for Highly Efficient Perovskite Light-Emitting Devices. Nano Lett. 2019, 19 (3), 1552-1559.

Li, X. C.; Meng, Y.; Fan, R.; Fan, S. F.; Dang, C. Q.; Feng, X. B.; Ho, J. C.; Lu, Y. High elasticity of CsPbBr3 perovskite hanowires for flexible electronics. Nano Res. 2021, 14 (11), 4033-4037.

Liang, F. X.; Jiang, J. J.; Zhao, Y. Z.; Zhang, Z. X.; Wu, D.; Zeng, L. H.; Tsang, Y. H.; Luo, L. B. Fabrication of MAPbBr3 Single Crystal p-n Photodiode and n-p-n Phototriode for Sensitive Light Detection Application. Adv. Funct. Mater. 2020, 30 (32), 2001033.

Zeng, L. H.; Chen, Q. M.; Zhang, Z. X.; Wu, D.; Yuan, H.; Li, Y. Y.; Qarony, W.; Lau, S. P.; Luo, L. B.; Tsang, Y. H. Multilayered PdSe2/perovskite Schottky junction for fast, self-powered, polarization-sensitive, broadband photodetectors, and image sensor application. Adv. Sci. 2019, 6 (19), 1901134.

(56) References Cited

PUBLICATIONS

Deng, H.; Yang, X.; Dong, D.; Li, B.; Yang, D.; Yuan, S.; Qiao, K.; Cheng, Y.-B.; Tang, J.; Song, H., Flexible and semitransparent organolead triiodide perovskite network photodetector arrays with high stability. Nano letters 2015, 15 (12), 7963-7969.

Deng, H.; Dong, D.; Qiao, K.; Bu, L.; Li, B.; Yang, D.; Wang, H.-E.; Cheng, Y.; Zhao, Z.; Tang, J., Growth, patterning and alignment of organolead iodide perovskite nanowires for optoelectronic devices. Nanoscale 2015, 7 (9), 4163-4170.

Deng, W.; Zhang, X.; Huang, L.; Xu, X.; Wang, L.; Wang, J.; Shang, Q.; Lee, S. T.; Jie, J., Aligned single-crystalline perovskite microwire arrays for high-performance flexible image sensors with long-term stability. Advanced Materials 2016, 28 (11), 2201-2208.

Gao, L.; Zeng, K.; Guo, J.; Ge, C.; Du, J.; Zhao, Y.; Chen, C.; Deng, H.; He, Y.; Song, H., Passivated single-crystalline CH3NH3PbI3 nanowire photodetector with high detectivity and polarization sensitivity. Nano letters 2016, 16 (12), 7446-7454.

Zhou, Q.; Park, J. G.; Nie, R.; Thokchom, A. K.; Ha, D.; Pan, J.; Seok, S. I.; Kim, T., Nanochannel-assisted perovskite hanowires: from growth mechanisms to photodetector applications. ACS nano 2018, 12 (8), 8406-8414.

Wu, C. Y.; Peng, W.; Fang, T.; Wang, B.; Xie, C.; Wang, L.; Yang, W. H.; Luo, L. B., Asymmetric Contact-Induced Self- Driven Perovskite-Microwire-Array Photodetectors. Advanced Electronic Materials 2019, 5 (5), 1900135.

Cao, F.; Tian, W.; Wang, M.; Cao, H.; Li, L., Semitransparent, flexible, and self-powered photodetectors based on ferroelectricity-assisted perovskite nanowire arrays. Advanced Functional Materials 2019, 29 (24), 1901280.

Huang, R.; Lin, D.-H.; Liu, J.-Y.; Wu, C.-Y.; Wu, D.; Luo, L.-B., Nanochannel-confined growth of crystallographically orientated perovskite nanowire arrays for polarization-sensitive photodetector application. Science China Materials 2021, 64 (10), 2497-2506.

Ren, W.; Tan, Q.; Wang, Q.; Liu, Y., Hybrid organolead halide perovskite microwire arrays/single CdSe nanobelt for a high-performance photodetector. Chemical Engineering Journal 2021, 406, 126779.

"Li, S. X.; Xu, Y. S.; Li, C. L.; Guo, Q.; Wang, G.; Xia, H.; Fang, H. H.; Shen, L.; Sun, H. B., Perovskite Single-Crystal Microwire-Array Photodetectors with Performance Stability beyond 1 Year. Advanced Materials 2020, 32 (28), 2001998".

Waleed, A.; Tavakoli, M. M.; Gu, L.; Wang, Z.; Zhang, D.; Manikandan, A.; Zhang, Q.; Zhang, R.; Chueh, Y.-L.; Fan, Z., Lead-free perovskite nanowire array photodetectors with drastically improved stability in nanoengineering templates. Nano letters 2017, 17 (1), 523-530.

Zhou, H.; Song, Z.; Grice, C. R.; Chen, C.; Zhang, J.; Zhu, Y.; Liu, R.; Wang, H.; Yan, Y., Self-powered CsPbBr3 nanowire photodetector with a vertical structure. Nano Energy 2018, 53, 880-886.

Gui, P.; Chen, Z.; Li, B.; Yao, F.; Zheng, X.; Lin, Q.; Fang, G., High-performance photodetectors based on single all-inorganic CsPbBr3 perovskite microwire. ACS Photonics 2018, 5 (6), 2113-2119.

"Mo, X.; Li, X.; Dai, G.; He, P.; Sun, J.; Huang, H.; Yang, J., All-inorganic perovskite CsPbBr3 microstructures growth via chemical vapor deposition for high-performance photodetectors. Nanoscale 2019, 11 (44), 21386-21393".

Tong, G.; Jiang, M.; Son, D.-Y.; Qiu, L.; Liu, Z.; Ono, L. K.; Qi, Y., Inverse growth of large-grain-size and stable inorganic perovskite micronanowire photodetectors. ACS Applied Materials & Interfaces 2020, 12 (12), 14185-14194.

Tong, G.; Jiang, M.; Son, D. Y.; Ono, L. K.; Qi, Y., 2D Derivative Phase Induced Growth of 3D All Inorganic Perovskite Micro-Nanowire Array Based Photodetectors. Advanced Functional Materials 2020, 30 (34), 2002526.

Pan, S.; Zou, H.; Wang, A. C.; Wang, Z.; Yu, J.; Lan, C.; Liu, Q.; Wang, Z. L.; Lian, T.; Peng, J., Rapid Capillary-Assisted Solution Printing of Perovskite Nanowire Arrays Enables Scalable Production of Photodetectors. Angewandte Chemie International Edition 2020, 59 (35), 14942-14949.

Winterer, F.; Walter, L. S.; Lenz, J.; Seebauer, S.; Tong, Y.; Polavarapu, L.; Weitz, R. T., Charge Traps in All-Inorganic CsPbBr3 Perovskite Nanowire Field-Effect Phototransistors. Advanced Electronic Materials 2021, 7 (6), 2100105.

Yu, M.; Zhang, D.; Xu, Y.; Lin, J.; Yu, C.; Fang, Y.; Liu, Z.; Guo, Z.; Tang, C.; Huang, Y., Surface ligand engineering of CsPbBr3 perovskite nanowires for high-performance photodetectors. Journal of Colloid and Interface Science 2022, 608, 2367-2376.

Waleed, A.; Tavakoli, M. M.; Gu, L.; Hussain, S.; Zhang, D.; Poddar, S.; Wang, Z.; Zhang, R.; Fan, Z., All inorganic cesium lead iodide perovskite nanowires with stabilized cubic phase at room temperature and nanowire array-based photodetectors. Nano letters 2017, 17 (8), 4951-4957.

Zhou, Y.; Luo, J.; Zhao, Y.; Ge, C.; Wang, C.; Gao, L.; Zhang, C.; Hu, M.; Niu, G.; Tang, J., Flexible Linearly Polarized Photodetectors Based on All-Inorganic Perovskite CsPbI3 Nanowires. Advanced Optical Materials 2018, 6 (22), 1800679.

Yang, T.; Zheng, Y.; Du, Z.; Liu, W.; Yang, Z.; Gao, F.; Wang, L.; Chou, K.-C.; Hou, X.; Yang, W., Superior photodetectors based on all-inorganic perovskite CsPbI3 nanorods with ultrafast response and high stability. Acs Nano 2018, 12 (2), 1611-1617.

Chen, G.; Feng, J.; Gao, H.; Zhao, Y.; Pi, Y.; Jiang, X.; Wu, Y.; Jiang, L., Stable a-CsPbI3 Perovskite Nanowire Arrays with Preferential Crystallographic Orientation for Highly Sensitive Photodetectors. Advanced Functional Materials 2019, 29 (13), 1808741.

Wu, X.; Sun, J.; Shao, H.; Zhai, Y.; Li, L.; Chen, W.; Zhu, J.; Dong, B.; Xu, L.; Zhou, D., Self-powered UV photodetectors based on CsPbCl3 nanowires enabled by the synergistic effect of acetate and lanthanide ion passivation. Chemical Engineering Journal 2021, 426, 131310.

Pradhan, B.; Kumar, G. S.; Sain, S.; Dalui, A.; Ghorai, U. K.; Pradhan, S. K.; Acharya, S., Size Tunable Cesium Antimony Chloride Perovskite Nanowires and Nanorods. Chemistry of Materials 2018, 30 (6), 2135-2142.

Han, M.; Sun, J.; Peng, M.; Han, N.; Chen, Z.; Liu, D.; Guo, Y.; Zhao, S.; Shan, C.; Xu, T., Controllable growth of lead-free all-inorganic perovskite nanowire array with fast and stable near-infrared photodetection. The Journal of Physical Chemistry C 2019, 123 (28), 17566-17573.

Tang, X.; Zhou, H.; Pan, X.; Liu, R.; Wu, D.; Wang, H., All-inorganic halide perovskite alloy nanowire network photodetectors with high performance. ACS Applied materials & interfaces 2020, 12 (4), 4843-4848.

* cited by examiner

METHOD OF FABRICATING A HALIDE PEROVSKITE

TECHNICAL FIELD

The invention relates to a method of fabricating a halide perovskite. The invention also relates to a halide perovskite nanowire and a photoelectronic device with the halide perovskite nanowire.

BACKGROUND

Known methods for producing halide perovskites (HPs) include solution synthesis processes and chemical vapor deposition (CVD) processes. Compared with the solution synthesis processes, CVD processes are better for controlling the geometry of HP nanostructures, such as diameter, length, shape, and phase. Crystalline HPs produced by CVD could serve as perfect platforms for exploring their fundamental physical properties and practical device implementations.

To date, the most used CVD-based growth technique for HP synthesis is the vapor-solid (VS) process, in which the vapor-phase precursor is converted into a solid product via surface adsorption. This way, the yielded VS-HP nanostructures are determined by the crystal surface energy and substrate feature. For instance, sapphire, mica, and $SrTiO_3$ are used to grow all-inorganic HP nanostructures with specific crystallographic orientations. At the same time, high growth temperature, stringent substrate requirement, and elusive heteroepitaxial relationships are always involved in the VS process, and thus may impose constraints on the material synthesis and further utilization.

Another example of a CVD-based growth technique is the vapor-liquid-solid (VLS) process where nanostructures are precipitated from the supersaturated molten seeds. Compared to the VS process, the VLS process is more attractive for achieving controllable growth and bottom-up synthesis of integration-ready nanostructures. VLS-grown all-inorganic $CsPbX_3$ (X=Cl, Br, or I) HPs nanowires (NWs) and core-shell perovskite NWs using Sn nanoparticles as catalytic seeds are known, due to the low melting temperature (232° C.) and good compatibility to Pb-based HPs of Sn. Such VLS-HP synthesis was achieved at the expense of the Sn impurity atom diffusion into HP host lattices, which could deteriorate the material homogeneities regarding phase purity, surface morphology, and electrical characteristics.

SUMMARY

In a first aspect, there is provided a method of fabricating a halide perovskite having a general formula of $ABX_3$, wherein A (e.g., Cs), B (e.g., Pb or Sn), and X (e.g., I, Br, or Cl) are inorganic elements and X is a halide, the method comprising a vapor-liquid-solid process triggered by a catalyst formed from a noble metal. Preferably, A is Cs and B is Pb.

Optionally, the vapor-liquid-solid process is enabled by a spontaneous exothermic nucleation process.

Optionally, the method is at least partly conducted at a temperature of about 250° C. to about 350° C., e.g., about 290° C.; for example, this temperature may be the growth temperature for the vapor-liquid solid process. Additionally, the method may be partly conducted at a temperature of about 400° C. to about 500° C., e.g., about 430° C.; for example, this temperature may be the heating temperature for a source evaporation process.

Preferably, the noble metal is Au and the catalyst is in the form of Au nanoparticles with a diameter of about 10 nm to about 200 nm, e.g., about 100 nm. The catalyst may be transformed into a Au—Pb or Au—Sn alloying catalyst.

Optionally, the method further comprises the step of preparing the catalyst by drop-casting a dispersion solution of Au nanoparticles onto a growth substrate. The growth substrate may be an amorphous $SiO_2$/Si growth substrate with a $SiO_2$ thickness of about 270 nm.

Optionally, the method further comprises the steps of mixing CsI and $PbX_2$ or CsI and $SnX_2$ with a molar ratio of 2:1 and heating the mixture in a first heating zone (upstream) to serve as a vapor-phase Cs, Pb or Sn, and X source. The heating temperature of the first heating zone may be about 400° C. to about 500° C., e.g., 430° C.

Optionally, the method further comprises the step of placing the growth substrate with the catalyst into a second heating zone (downstream) at a growth temperature of about 250° C. to about 350° C. to react with the vapor-phase Cs, Pb or Sn, and X source such that Au nanoparticles alloy with Pb or Sn and convert to a Au—Pb or Au—Sn alloying catalyst. The step may take 120 mins for the growth of $CsPbX_3$ or $CsSnX_3$ nanowire on the growth substrate.

Optionally, the second heating zone may have a growth temperature of about 290° C. The second heating zone may have a growth pressure of 0.8 Torr. The second heating zone may include a carrier gas flow comprises Ar at about 80 sccm.

Optionally, the Au—Pb or Au—Sn alloying catalyst comprises a eutectic alloying catalyst, e.g., having a melting temperature of about 212° C. for Au—Pb alloying catalyst.

Optionally, the $CsPbX_3$ or $CsSnX_3$ nanowire grows along a plane with a lower surface free energy than other planes, via a supersaturation process. For example, the $CsPbX_3$ or $CsSnX_3$ nanowire grows along the (100) plane of the $CsPbX_3$ or $CsSnX_3$ nanowire. The $CsPbX_3$ or $CsSnX_3$ nanowire may be selected from a group comprising $CsPbI_3$, $CsPbCl_3$, $CsPbBr_3$, $CsSnI_3$, $CsSnCl_3$, and $CsSnBr_3$ nanowires.

Optionally, the $CsPbX_3$ or $CsSnX_3$ nanowire is about 15 μm to about 20 μm in length and about 200 nm in diameter.

In a second aspect, there is provided a $ABX_3$ nanowire formed by a method with a vapor-liquid-solid process triggered by a noble metal catalyst, where the $ABX_3$ nanowire is vertically formed on a growth substrate, and A is Cs, B is Pb or Sn, and X is a halide.

Optionally, X is selected from Cl, Br and I.

Optionally, the $ABX_3$ nanowire is terminated with a spherical catalytic tip.

Optionally, when B is Pb and X is I, resulting $CsPbI_3$ nanowire comprises an orthorhombic perovskite phase, e.g., at room temperature. When B is Pb and X is Cl or Br, resulting $CsPbCl_3$ or $CsPbBr_3$ may comprise a cubic perovskite phase, e.g., at room temperature.

Optionally, the $CsPbI_3$ nanowire emits red light across its entire length. The $CsPbI_3$ nanowire may comprise an optically active orthorhombic black phase, e.g., a pseudo cubic Pm-3m phase.

Optionally, the spherical catalytic tip comprises a Au—Pb or Au—Sn seed. The Au—Pb or Au—Sn seed may comprise a eutectic alloying catalyst In a third aspect, there is provided a photoelectronic device comprising a $ABX_3$ nanowire where A is Cs, B is Pb or Sn, and X is a halide. The $ABX_3$ nanowire may be formed by a method with a vapor-liquid-solid process triggered by a catalyst formed from a noble metal.

Optionally, the photoelectronic device comprises a visible light photodetector.

Optionally, the $ABX_3$ nanowire is dry transferred onto a Au electrode.

Optionally, the Au electrode is fabricated with a 2 μm channel length and is fabricated on a $SiO_2$/Si substrate.

When the $ABX_3$ nanowire is a $CsPbX_3$ nanowire, the visible light photodetector may have a dark current of below about 0.1 pA, a light current of about 28 nA, a specific detectivity of about $1.1 \times 10^{15}$ Jones, a responsivity of about 1400 $A \cdot W^{-1}$ with an incident light intensity of about 5 $mW/cm^2$, or a photoresponse time of about 120 s.

Other features and aspects of the invention will become apparent by consideration of the detailed description and accompanying drawings. Any feature(s) described herein in relation to one aspect or embodiment may be combined with any other feature(s) described herein in relation to any other aspect or embodiment as appropriate and applicable.

BRIEF DESCRIPTION OF THE DRAWINGS

Embodiments of the invention will now be described, by way of example, with reference to the accompanying drawings, in which.

DETAILED DESCRIPTION

Before any embodiments of the invention are explained in detail, it is to be understood that the invention is not limited in its application to the details of the described embodiments set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. Terms of degree, such as "about", are understood by those of ordinary skill to refer to reasonable ranges outside of the given value, for example, general tolerances associated with manufacturing, assembly, testing, and use of the described embodiments.

To eliminate the above-mentioned impurity doping in VLS-grown HPs with the use of Sn nanoparticles, the inventors have derived, through trials and experiments, that utilizing typical noble metals (e.g., Au, Pd, and Pt) to seed the VLS growth of HPs is a feasible route due to the minimal lattice diffusion offered by them.

In one embodiment, there is provided a method of fabricating a perovskite material, commonly known as having a general formula of $ABX_3$. The method includes a vapor-liquid-solid (VLS) process that is triggered by a catalyst formed from a noble metal. Preferably, the perovskite material is an all-inorganic perovskite (i.e., A, B, and X are inorganic elements), e.g., an all-inorganic halide perovskite. A may be Cs and B may be Pb or Sn, while X may be a halide such as Cl, Br, and I.

In one embodiment, $ABX_3$ is selected from a group comprising $CsPbI_3$, $CsPbCl_3$, $CsPbBr_3$, $CsSnI_3$, $CsSnCl_3$, $CsSnBr_3$ nanowires. These nanowires may be about 10 μm to about 25 μm in length and about 10 nm to about 200 nm in diameter. As a result of the VLS process, the nanowire may be terminated with a spherical catalytic tip, e.g., containing a catalyst-Pb or -Sn seed.

The $CsPbI_3$, $CsPbCl_3$, $CsPbBr_3$, $CsSnI_3$, $CsSnCl_3$, $CsSnBr_3$ nanowires, which have excellent material stability, high optical absorption, and long carrier diffusion length, may be used for photoelectronic devices (e.g., visible light photodetectors) and field-effect transistors. For example, the nanowires may be used as the photosensitive channels of the photoelectronic device.

Figure 1:
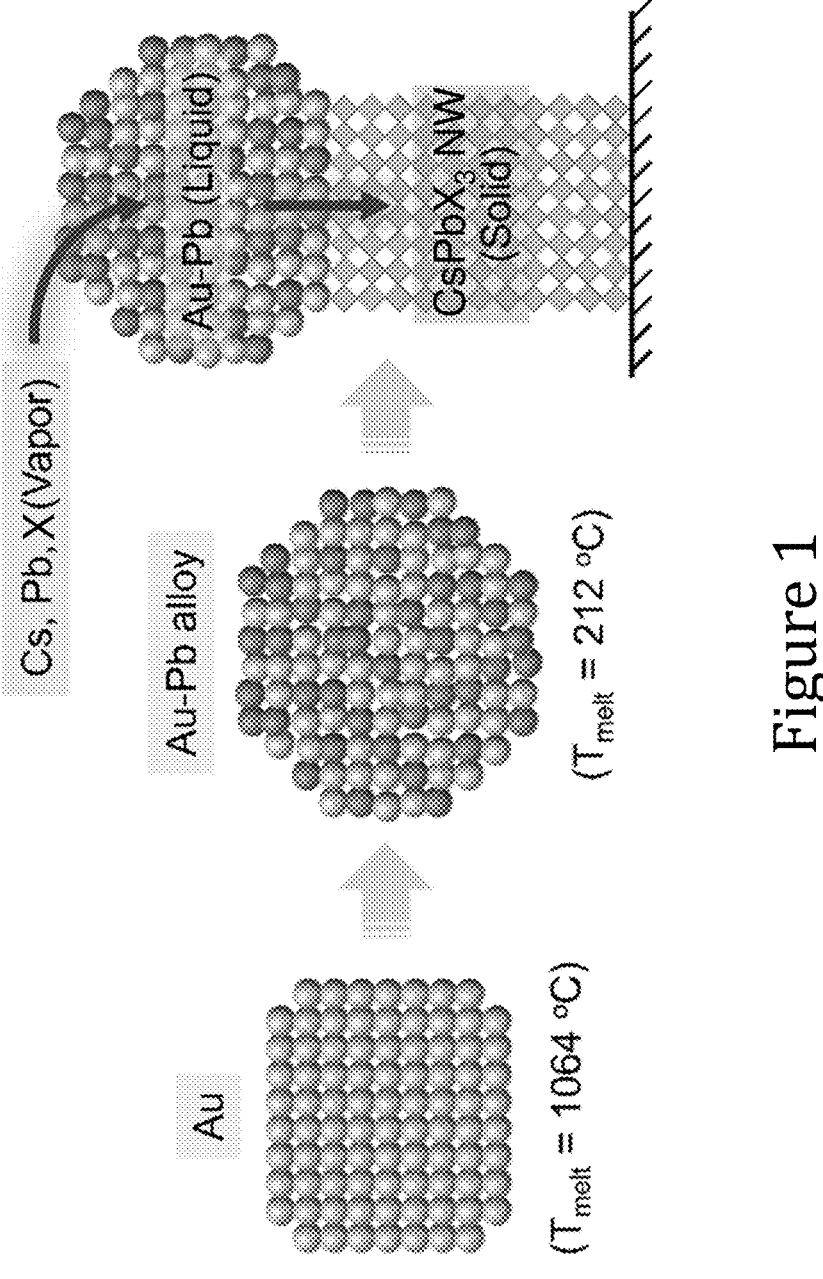
FIG. 1 is a schematic diagram showing the method of fabricating $CsPbX_3$ of the invention with a vapor-liquid-solid (VLS) process in accordance with one example embodiment of the invention.
Figure 2:
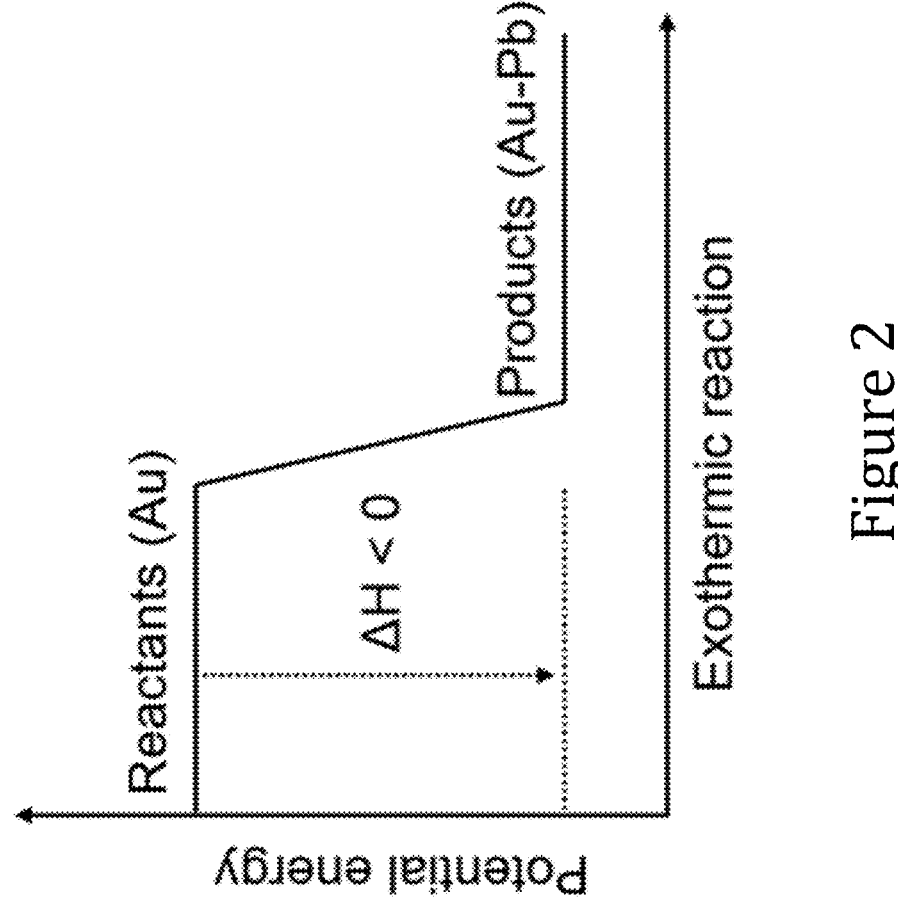
FIG. 2 shows the exothermic process of the Au—Pb alloying process in the method of FIG. 1.

FIGS. 1 and 2 show the method of fabricating $CsPbX_3$, as an example of $ABX_3$, with a VLS process triggered by Au catalytic seeds. As used herein, a VLS process involves reactions between a catalytic liquid alloy phase that rapidly adsorbs a vapor to supersaturation levels to form nucleated seeds, allowing crystals (e.g., in the form of nanowires) to grow vertically at the liquid-solid interface on a growth substrate. The term "vertically" means the nanowires grow perpendicular to the substrate, e.g., along the [100] direction. Preferably, the VLS process is a seeded growth process, where the HP is directly grown on the growth substrate via Au catalytic seeds, rather than being converted from VS surface adsorption, thus avoiding formation of randomly oriented domains and rough surfaces of the HP. As will be appreciated by the person skilled in the art, the physical characteristics of the nanowires can be readily controlled depending on the size and physical properties of the liquid alloy.

Before the VLS process, the method may include the step of preparing the catalyst seeds, e.g., by depositing Au nanoparticles with a diameter of about 10 nm to 200 nm onto the growth substrate through a drop casting method. The method may also include the step of preparing the vapor-phase Cs, Pb or Sn, and X source, e.g., by mixing CsX and PbX powders or CsX and SnX powders with a molar ratio of 2:1.

The growth of HP is typically determined by the supply of vapor source, which is controlled by the growth temperature or the growth pressure during the VLS process. When the growth temperature is too low, problems such as increased precursor decomposition, lower kinetic barrier for nucleation and decreased adatom diffusion length may exist, and thus it may not be able to achieve the desired nanowire morphology of the HP. However, if the growth temperature is too high, shorter nanowires may be grown due to the unlikely nucleation of the HP. On the other hand, when the growth pressure is too low, both HP and the catalyst may be found to coexist on the growth substrate. Increasing the growth pressure may facilitate evaporation of source material and increase the amount of source vapor, thus increasing the density of HP and length of the nanowire. However, if the growth pressure is too high, shorter nanowires may be grown due to the limited supply of the vapor.

In one embodiment, the VLS process may be conducted in a two-zone CVD system equipped with a furnace having a first heating region (upstream) with a higher temperature, and a second heating region (downstream) with a lower temperature. The prepared source materials may be placed in the first heating region with a set temperature of about 400° C. to about 500° C., and the substrate deposited with the Au nanoparticles may be placed in the second heating region with a set temperature of about 250° C. to about 350° C. The second heating region may also have a pressure of about 0.5 Torr to about 2 Torr, and include a carrier gas flow with Ar at about 70 sccm to about 90 sccm.

The Au catalyst has a high melting point of 1064° C. and thus it is difficult to exist in the liquid state. Nonetheless, with the introduction of Pb or Sn vapor, Au would react with Pb or Sn vapor to form Au—Pb or Au—Sn eutectic alloy as the catalytic liquid alloy phase which has a melting temperature of about 212° C. in the case of Au—Pb. As shown in FIG. 2, the formation enthalpy of Au—Pb catalytic seeds is negative (ΔH<0), which means the formation of Au—Pb eutectic alloy is a spontaneous exothermic nucleation process. In an energetically favored way, the Pb vapor would react with Au seeds to form molten Au—Pb droplets, with the corresponding melting temperatures decreased from 1064° C. to 212° C., demonstrating the efficient VLS growth of CsPbI$_3$ at low temperatures. The molten droplets can then be supersaturated through the addition of the vapor-phase precursors Cs, Pb, and X. Sn is expected to have the same reaction as Pb with Au to form Au—Sn catalyst. The growth conditions may be maintained for a predetermined period of time, e.g., about 60 mins to about 300 mins, for a better yield of HP.

Hereinafter, the present invention is described more specifically by way of examples using a Au-seeded CsPbI$_3$ NW, but the present invention is not limited thereto.

Unless otherwise specifically provided, all tests herein are conducted at standard conditions which include a room and testing temperature of 25° C., sea level (1 atm.) pressure, pH 7, and all measurements are made in metric units. Furthermore, all percentages, ratios, etc. herein are by weight, unless specifically indicated otherwise. It is understood that unless otherwise specifically noted, the materials compounds, chemicals, etc. described herein are typically commodity items and/or industry-standard items available from a variety of suppliers worldwide.

Synthesis of CsPbI$_3$

Figure 3C:
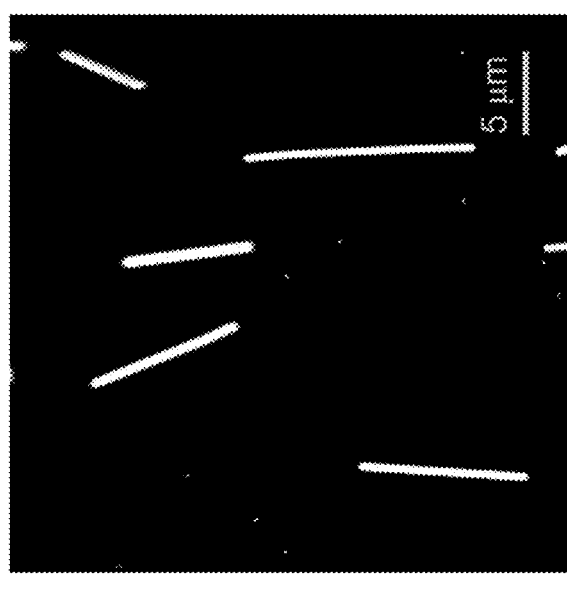
FIG. 3C is an enlarged SEM image of Au-seeded VLS-grown $CsPbI_3$ nanowires on substrates.
Figure 3C:
Figure 3B:
FIG. 3B is an SEM image of Au-seeded VLS-grown $CsPbI_3$ nanowires (NWs) on substrates.
Figure 3B:
Figure 3A:
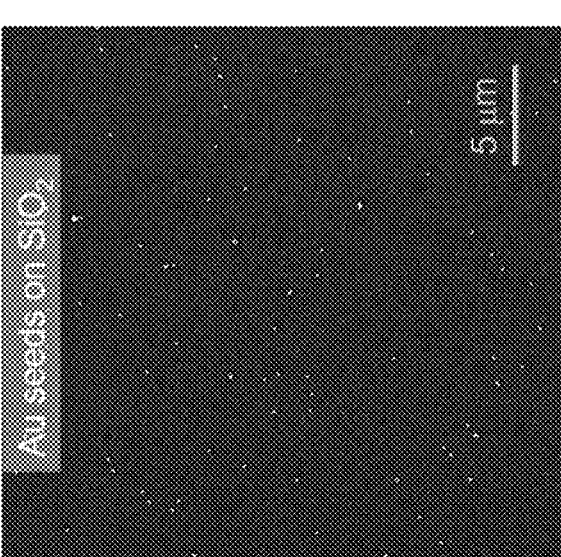
FIG. 3A is a scanning electron microscopic (SEM) image of Au nanoparticles drop-casted on amorphous $SiO_2$/Si substrates.

Au catalyst seeds were prepared by drop-casting the dispersion solution of Au nanoparticles (with a diameter of 100 nm) on 270-nm-thick amorphous SiO$_2$/Si growth substrates, as shown in FIG. 3A. The VLS growth of CsPbI$_3$ NWs was carried out in a two-zone CVD system. The vapor-phase Cs, Pb, and I source, which contains mixed CsI/PbI$_2$ powder with a molar ratio of 2:1, was placed in a first heating zone of the CVD system with a set temperature of 430° C.

The growth substrates with the pre-deposited Au catalyst seeds were placed in the second heating zone with a set temperature of 290° C. With a growth pressure of 0.8 Torr and an Ar carrier gas flow of 80 sccm, the Au nanoparticles alloyed with Pb vapor and fully converted to Au—Pb eutectic alloying catalysts, which is responsible for the CsPbI$_3$ NW growth. After about 120 mins, the reaction was terminated.

Characterization of CsPbI$_3$

Surface morphologies of the NWs were examined using a scanning electron microscope (SEM) and a transmission electron microscope (TEM). Crystal structures were determined by collecting the XRD pattern on a powder diffractometer and imaging with a high-resolution TEM. Elemental mappings and line scan were performed using an energy dispersive X-ray (EDS) detector.

As shown in FIGS. 3B and 3C, the vertically grown CsPbI$_3$ NWs are 15-20 μm in length and ~200 nm in diameter, exhibiting a decent morphology uniformity.

Figures 4A, 4B, 4C:
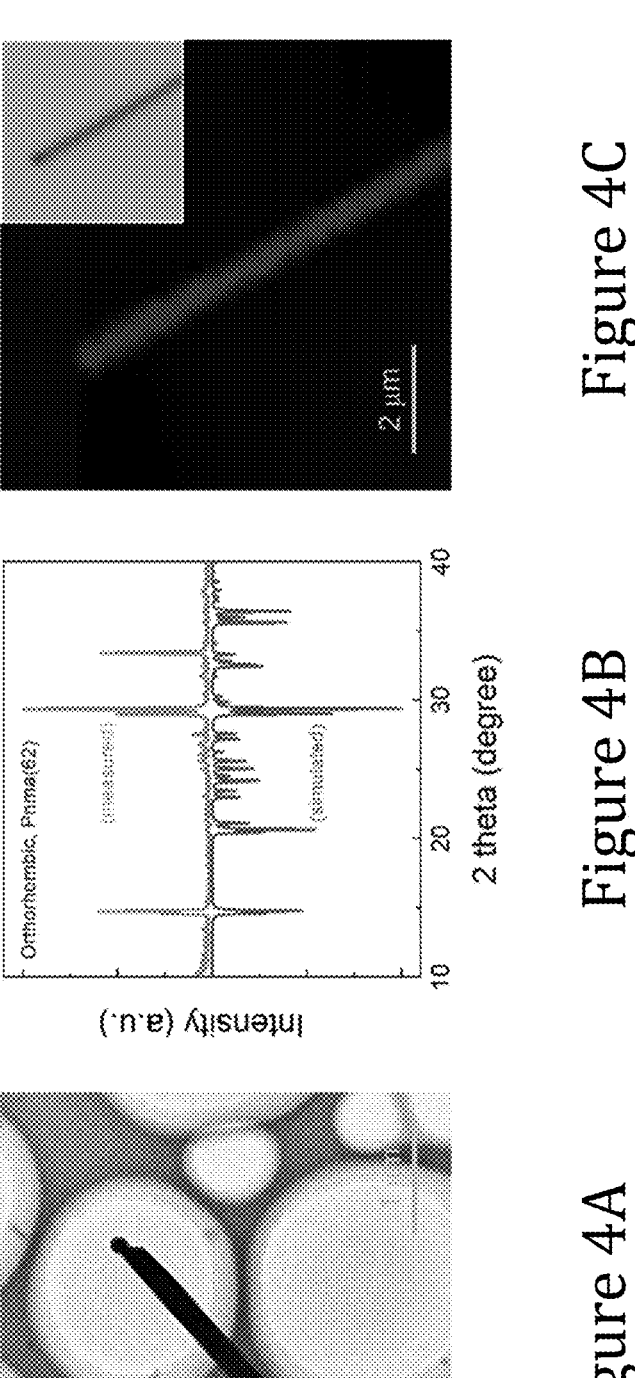
FIG. 4A is a transmission electron microscopic (TEM) image of individual $CsPbI_3$ nanowires grown with Au catalytic seeds.
FIG. 4B shows the x-ray diffraction (XRD) pattern of a Au-seeded VLS-grown $CsPbI_3$ nanowire.
FIG. 4C shows the photoluminescence (PL) mapping of a Au-seeded $CsPbI_3$ nanowire with the inset showing the optical image thereof.
Figures 5A, 5B, 5C:
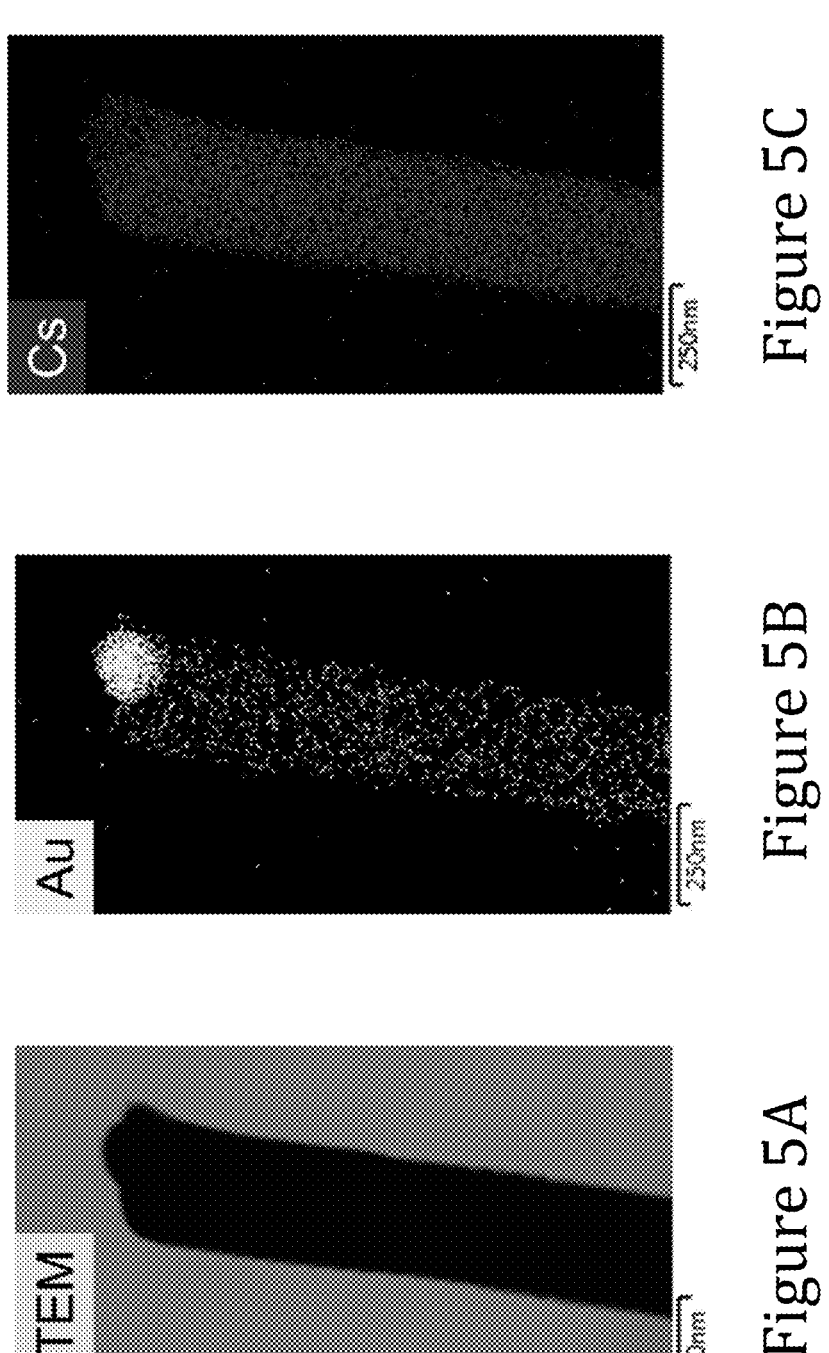
FIG. 5A is a scanning transmission electron microscopic (STEM) image of a Au-seeded VLS-grown $CsPbI_3$ nanowire.
FIG. 5B is a corresponding energy dispersive spectrometry (EDS) mapping of Au element in the VLS-grown $CsPbI_3$ nanowire of FIG. 5A.
FIG. 5C is a corresponding EDS mapping of Cs element in the $CsPbI_3$ nanowire of FIG. 5A.
Figure 5E:
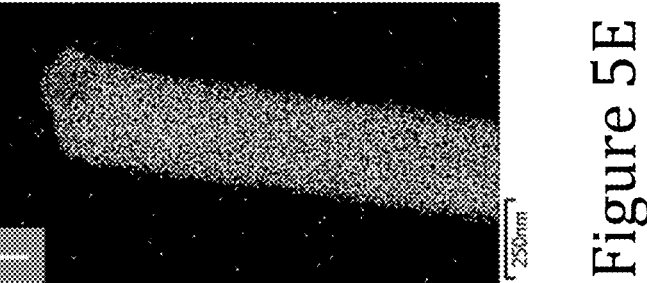
FIG. 5E is a corresponding EDS mapping of I element in the $CsPbI_3$ nanowire of FIG. 5A.
Figure 5D:
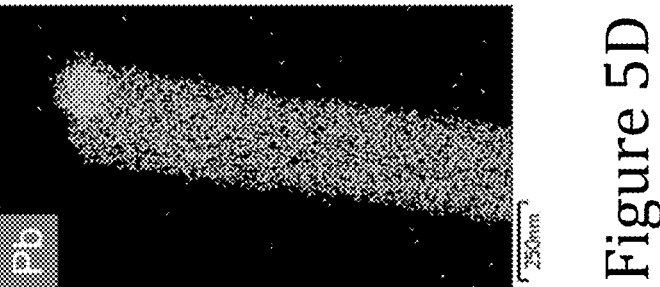
FIG. 5D is a corresponding EDS mapping of Pb element in the $CsPbI_3$ nanowire of FIG. 5A.

As shown in the TEM image in FIG. 4A, all NWs are terminated at the tip region with characteristic spherical catalytic seeds, indicating the VLS growth process. Moreover, control experiments on SiO$_2$ substrates without predeposited Au seeds showed no NW growth, confirming that Au seeds are necessary to trigger the NW growth on such amorphous substrates.

To study the crystal structure, the XRD pattern was measured from Au-seeded CsPbI$_3$ NWs (FIG. 4B). All the XRD peaks could be aligned to the orthorhombic CsPbI$_3$ (Pnma (62), a=8.856 Å, b=8.576 Å, c=12.472 Å), corresponding to an adapted crystal structure of perovskite featuring with tilted [PbI$_6$]$^{4-}$ octahedra.

From the PL mapping result shown in FIG. 4C, the CsPbI$_3$ NW emits red light across its entire length, which also indicates the orthorhombic black phase of the Au-seeded CsPbI$_3$ perovskite NWs, instead of the electronically inactive yellow δ-phase (non-perovskite phase) that possesses a wide bandgap of 2.7 eV. Notably, there are three black perovskite phases, including cubic (α-phase), tetragonal (β-phase), and orthorhombic (γ-phase), which are optically active and hence useful for solar cells, photodetectors, light-emitting diodes, etc. Due to the group-subgroup relations, the orthorhombic Pnma phase could be regarded as pseudo cubic Pm-3m phase.

The energy-dispersive X-ray spectroscopy (EDS) mapping shown in FIGS. 5A to 5E was used to characterize the Au-seeded VLS-grown CsPbI$_3$ NW in detail. Specifically, the catalytic tip of the NW is mainly consisted of Au and Pb elements, in which the relatively richer Pb part in the Au—Pb catalytic tip would lower the melting temperature potentially down to 212° C. for the efficient supersaturation process of the catalyst tip. When heating to the growth temperature (i.e., 290° C.), the molten Au—Pb seeds would act as a preferential adsorption position for the incoming vapor sources until a supersaturation condition is reached. Due to the low solubility of Cs and I in Au—Pb alloy, the elemental content of Cs and I is low in the NW tip, revealing their precipitation priority in the supersaturation process. Besides, the component quantification is also conducted on the $CsPbI_3$ NW body, which highlights the uniform distribution of Cs, Pb, and I elements on the NW body with an ideal composition ratio of 1:1:3 which is in agreement with the stoichiometric ratio of $CsPbI_3$. Based on the EDS mapping in FIG. 5B, the Au elements also exist in the NW body, yet appearing in an optically inactive manner because the Au-based defect energy levels are out of the forbidden region. Thus, when incorporated into a photoelectronic device, as will be discussed later, the Au-seeded $CsPbI_3$ growth avoids the in-bandgap trap states (in contrast to the prior art Sn-seeded sample), contributing to outstanding device performances, especially in the case of a photodetector.

Figure 6C:
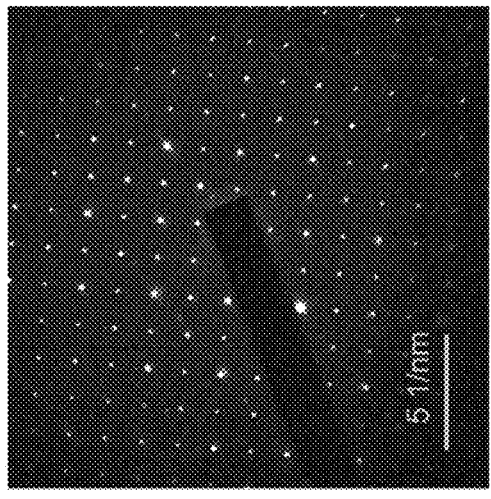
FIG. 6C is a corresponding SAED of the NW body region in FIG. 6A.
Figure 6B:
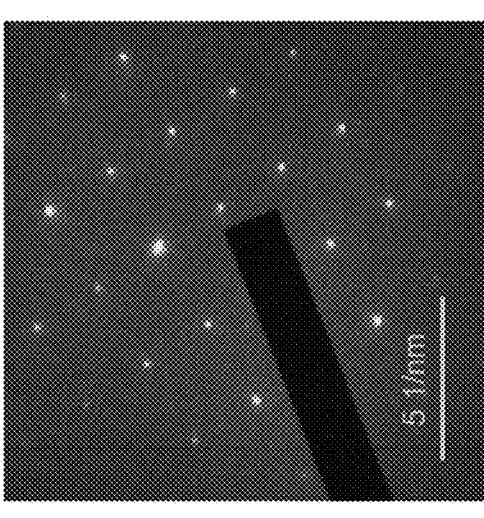
FIG. 6B is a corresponding selected area electron diffraction (SAED) of the Au—Pb catalytic tip region in FIG. 6A.
Figure 6A:
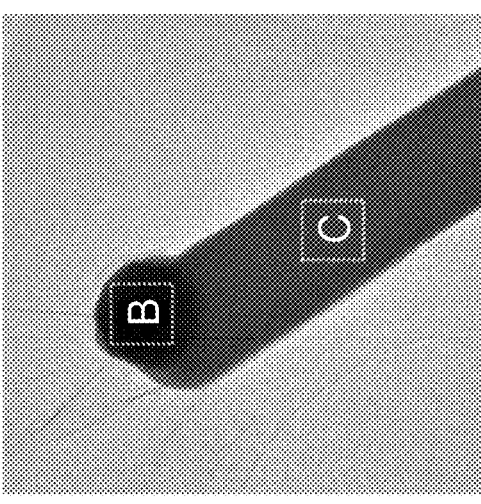
FIG. 6A is a high-resolution transmission electron microscopic (HRTEM) image of a Au-seeded $CsPbI_3$ nanowire.

As shown in FIGS. 6A to 6C, the crystal structure of the $CsPbI_3$ NW was further evaluated through high-resolution TEM and SAED. FIG. 6B shows the SAED pattern of the catalytic tip indexed to be $AuPb_3$ eutectic. From the Au—Pb phase diagram, the Pb-rich compositions show relatively low melting temperatures among the whole composition range. This fact benefits the low-temperature VLS growth of perovskite NWs since the molten Au—Pb seeds at growth conditions are needed. Besides, FIG. 6C shows the SAED pattern of the $CsPbI_3$ NW body indexed to be an orthorhombic phase, which agrees well with the XRD result.

The orthorhombic perovskite structure of $CsPbI_3$ NWs is thermally stable at room temperature because of the larger I-ionic radius than other halogens that would induce structural adaptation. Besides, as supported by the SAED pattern, since the (100) planes of $CsPbI_3$ NWs have lower surface free energy than other planes, the Au-seeded $CsPbI_3$ NWs is preferred to grow along [100] direction. Overall, the above structure and element analysis concludes that the $CsPbI_3$ NWs are grown via a supersaturation process at the molten Au—Pb seeds, following the VLS mechanism.
Preparation of Visible Light Photodetectors Individual $CsPbI_3$ NWs were configured into visible light photodetectors (PDs) to demonstrate their optoelectronic applications. The single-NW photodetectors were prepared by dry transferring the $CsPbI_3$ NWs from the growth substrates onto the pre-prepared Au paired electrodes. Such Au electrodes with a 2 μm channel length were fabricated by standard lithography and metallization on the 270-nm-thick $SiO_2$/Si substrates.
Characterization of Visible Light Photodetectors For photodetector measurements, Agilent 4155C semiconductor analyzer was employed to measure the I-V and I-T curves, while 532 nm laser diode was used as a light source.

Figures 7A, 7B:
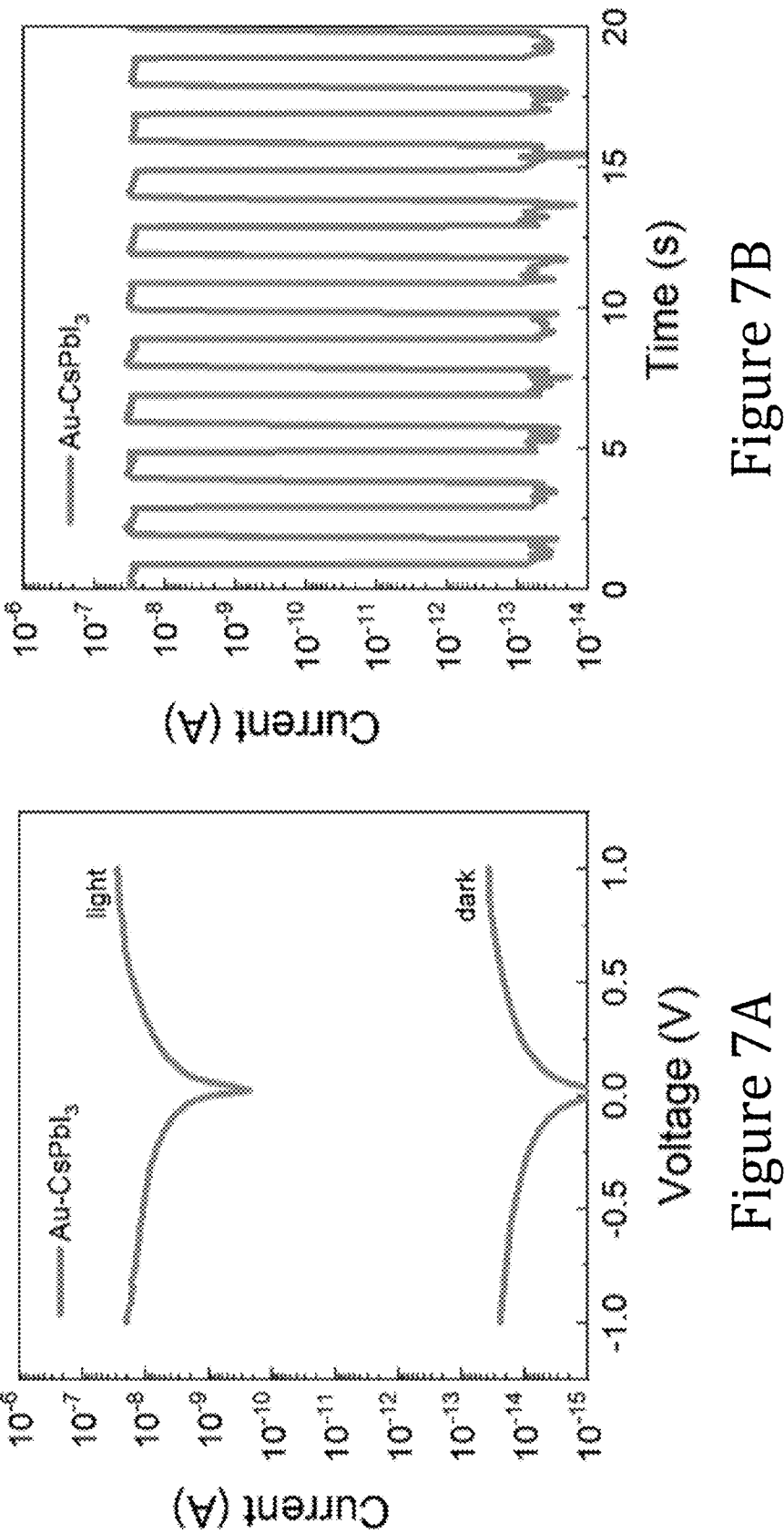
FIG. 7A shows the current-voltage (I-V) curves of $CsPbI_3$ NW photodetectors measured in 532-nm light and dark conditions.
FIG. 7B shows the current-temperature (I-T) curves of $CsPbI_3$ NW photodetectors with 0.5 Hz chopping light illumination and 1 V bias.

As shown in FIGS. 7A and 7B, the Au-seeded $CsPbI_3$ NW PDs show ultra-low dark currents ($I_{dark}$) of below 0.1 pA biased at 1 V. When light illumination with an intensity of ~5 mW/cm² is applied, the light current ($I_{light}$) of the Au-seeded $CsPbI_3$ NW PDs increases by more than ~$10^6$ times to 28 nA. Because of the lower noise signal (i.e., the lower dark current), the specific detectivity (D*) of Au-seeded PDs is calculated to be $1.1\times10^{15}$ Jones (cm·Hz$^{1/2}$W$^{-1}$), which outperforms most perovskite NW devices reported to date. The responsivity (R) is also an important figure-of-merit to evaluate PD performance. To be specific, the R value of Au-seeded $CsPbI_3$ NWs is as high as 1400 A·W$^{-1}$ with an incident light intensity of 5 mW/cm².

Figure 7C:
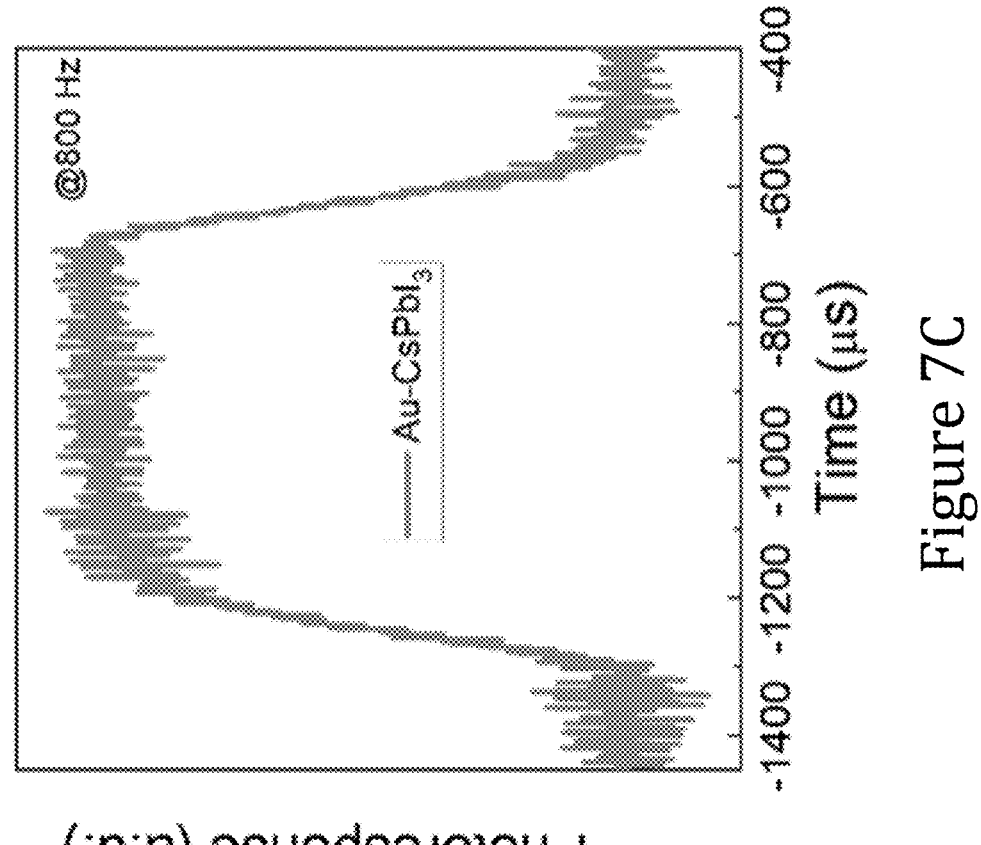
FIG. 7C shows the time-resolved photoresponse of the $CsPbI_3$ NW photodetectors measured at 800 Hz chopping frequency.

The transient response time is critical for PDs and highly depends on the efficient transport/collection of photo-generated carriers. A high-speed photoresponse measurement circuit, mainly composed of a current amplifier and digital oscilloscope, was used to record the dense photoresponse signals chopped at 800 Hz. As shown in FIG. 7C, the Au-seeded $CsPbI_3$ NW shows a faster photoresponse time of 120 μs when compared to most reported perovskite NWs to date. The obtained faster photoresponse from the Au-seeded $CsPbI_3$ NWs are originated from the minimized in-bandgap traps.

The above embodiments and examples provide an improved method of fabricating a HP that involves a VLS process. Enabled by a spontaneous exothermic nucleation process, the VLS growth temperature is lowered to 290° C., which is unachievable by conventional VS growth processes. Unlike other metal seeds, the enthalpy-mediated Au-seeded process would not lead to the impurity doping in HPs host lattice, thus eliminating the in-bandgap trap states and consequently avoids Shockley-Read-Hall recombination. This contributes to enhanced intrinsic material properties and photodetector performances, including a responsivity of 1400 A·W$^{-1}$, a light/dark current ratio of ~$10^6$, a detectivity of $1.1\times10^{15}$ Jones, and a photoresponse time of 120 μs.

Overall, the Au-seeded VLS HP growth process bridges one of the most powerful growth techniques with the emerging HPs materials, facilitating their nanostructures with tailored material properties and promising for practical electronic and photoelectronic utilizations based on low-dimensional HPs.

It will be appreciated by persons skilled in the art that numerous variations and/or modifications may be made to the invention as shown in the specific embodiments without departing from the spirit or scope of the invention as broadly described. The described embodiments of the invention should therefore be considered in all respects as illustrative, not restrictive.

The invention claimed is:

1. A method of fabricating a halide perovskite having a general formula of $ABX_3$, wherein A, B, and X are inorganic elements and X is a halide, the method comprising:
    providing a noble metal catalyst on a growth substrate;
    conducting a vapor-liquid-solid process, wherein the noble metal catalyst reacts with a vapor-phase B to form a molten alloy via a spontaneous exothermic nucleation process, and wherein the molten alloy acts as a preferential adsorption site for vapor sources comprising A, B, and X until a supersaturated molten alloy is formed, thereby enabling growth of the halide perovskite on the growth substrate; and
    precipitating the halide perovskite from the supersaturated molten alloy.

2. The method as claimed in claim 1, wherein A is Cs and B is Pb or Sn.

3. The method as claimed in claim 2, wherein the method is at least partly conducted at a temperature of about 250° C. to about 350° C.

4. The method as claimed in claim 3, wherein the method is at least partly conducted at a temperature of about 290° C.

5. The method as claimed in claim 2, wherein the noble metal is Au and the catalyst is in the form of Au nanoparticles.

6. The method as claimed in claim 5, wherein the molten alloy is Au—Pb or Au—Sn.

7. The method as claimed in claim 5, further comprising the step of preparing the catalyst by drop-casting a dispersion solution of Au nanoparticles onto the growth substrate.

8. The method as claimed in claim 7, wherein the Au nanoparticles has a diameter of about 10 nm to about 200 nm.

9. The method as claimed in claim 1, wherein the growth substrate is an amorphous $SiO_2/Si$ growth substrate with a $SiO_2$ thickness of about 270 nm.

10. The method as claimed in claim 7, further comprising the steps of mixing CsI and $PbX_2$ or CsI and $SnX_2$ with a molar ratio of 2:1 and heating the mixture in a first heating zone to serve as a vapor-phase Cs, Pb or Sn, and X source.

11. The method as claimed in claim 10, wherein the heating temperature of the first heating zone is about 400° C. to about 500° C.

12. The method as claimed in claim 11, wherein the heating temperature of the first heating zone is about 430° C.

13. The method as claimed in claim 10, further comprising the step of placing the growth substrate with the catalyst into a second heating zone at a growth temperature of about 250° C. to about 350° C. to react with the vapor-phase Cs, Pb or Sn, and X source such that Au nanoparticles alloy with Pb and convert to a Au—Pb or Au—Sn alloying catalyst.

14. The method as claimed in claim 13, wherein X is selected from Cl, Br and I.

15. The method as claimed in claim 13, wherein the second heating zone has a growth temperature of about 290° C.

16. The method as claimed in claim 13, wherein the second heating zone has a growth pressure of 0.8 Torr.

17. The method as claimed in claim 13, wherein the second heating zone includes a carrier gas flow comprises Ar at about 80 sccm.

18. The method as claimed in claim 13, wherein the molten alloy Au—Pb or Au—Sn comprises a eutectic alloying catalyst.

19. The method as claimed in claim 13, wherein the molten alloy Au—Pb has a melting temperature of about 212° C.

20. The method as claimed in claim 13, wherein the step takes 120 mins for the growth of $CsPbX_3$ or $CsSnX_3$ nanowire on the growth substrate.

21. The method as claimed in claim 20, wherein the $CsPbX_3$ or $CsSnX_3$ nanowire grows along a plane with a lower surface free energy than other planes, via a supersaturation process.

22. The method as claimed in claim 21, wherein the $CsPbX_3$ or $CsSnX_3$ nanowire grows along the (100) plane of the $CsPbX_3$ or $CsSnX_3$ nanowire.

23. The method as claimed in claim 22, wherein the $CsPbX_3$ or $CsSnX_3$ nanowire is selected from a group comprising $CsPbI_3$, $CsPbCl_3$, $CsPbBr_3$, $CsSnI_3$, $CsSnCl_3$, and $CsSnBr_3$ nanowires.

24. The method as claimed in claim 22, wherein the $CsPbX_3$ or $CsSnX_3$ nanowire is about 15 μm to about 20 μm in length and about 200 nm in diameter.

\* \* \* \* \*